(12) United States Patent
Liu (10) Patent No.: US 6,248,624 B1
(45) Date of Patent: Jun. 19, 2001

(54) METHOD FOR FORMING A DRAM STACKED CAPACITOR OF ZIG-ZAG CONFIGURATION

(75) Inventor: Chwen-Ming Liu, Hsin-Chu (TW)

(73) Assignee: Taiwan Semiconductor Manufacturing Company, Ltd., HsinChu (TW)

( * ) Notice: Subject to any disclaimer, the term of this patent is extended or adjusted under 35 U.S.C. 154(b) by 0 days.

(21) Appl. No.: 08/918,121

(22) Filed: Aug. 27, 1997

(51) Int. Cl.[7] ................................................ H01L 21/8242
(52) U.S. Cl. ............................................. 438/253; 438/254
(58) Field of Search ..................................... 438/253–256, 438/390–399; 118/723 E (56) References Cited

U.S. PATENT DOCUMENTS

| | | | |
|---|---|---|---|
| 5,164,337 | * | 11/1992 | Ogawa et al. . |
| 5,286,297 | * | 2/1994 | Moslehi et al. ................... 118/723 E |
| 5,372,648 | * | 12/1994 | Yamamoto et al. .............. 118/723 E |
| 5,387,546 | * | 2/1995 | Maeda et al. . |
| 5,545,585 | * | 8/1996 | Wang et al. .......................... 438/253 |
| 5,677,222 | * | 10/1997 | Tseng .................................... 438/253 |
| 5,770,499 | * | 6/1998 | Kwok et al. .......................... 438/253 |
| 5,814,153 | * | 9/1998 | Ishikawa .............................. 118/719 |

* cited by examiner

Primary Examiner—Jey Tsai
(74) Attorney, Agent, or Firm—Tung & Associates

(57) ABSTRACT

The present invention discloses a method for forming a fin-type DRAM stacked capacitor that has improved charge capacity by first depositing multiple layers of different insulating materials on a preprocessed semiconductor substrate, then dry etching a contact opening through the multiple layers of insulating materials to form a node contact on the substrate, and then wet etching the contact opening in an etchant that has different etch rates for the different insulating materials exposed in the contact opening such that a zig-zag configuration in the contact opening is formed for producing a capacitor has increased surface area and therefore increased charge capacity. Suitable insulating layers utilized are doped oxide layers and non-doped oxide layers which can be etched at different etch rates when an etchant of SC1 is used.

28 Claims, 5 Drawing Sheets

METHOD FOR FORMING A DRAM STACKED CAPACITOR OF ZIG-ZAG CONFIGURATION

FIELD OF THE INVENTION

The present invention generally relates to a method for forming dynamic random access memory (DRAM) stacked capacitor and more particularly, relates to a method for forming a fin-type DRAM stacked capacitor by depositing multiple layers of insulating materials in a single deposition process to enable the formation of a zig-zag configured bottom electrode of the capacitor in a subsequent wet etching process.

BACKGROUND OF THE INVENTION

In modern DRAM devices, small dimensions and high capacitance value per unit area of the capacitor are desirable characteristics for achieving a high charge storage capacity. A DRAM capacitor is normally formed by at least two layers of polysilicon films and one layer of a dielectric insulator. The DRAM devices have been named as dynamic because the cells can retain information only for a limited period of time and that they must be read and refreshed periodically. This is in contrast to a static random access memory (SRAM) cell which does not require periodic refresh signals in order to retain stored data.

A typical DRAM cell includes a field effect transistor and a storage capacitor. When DRAM cells were first developed, planar type storage capacitors which occupy large wafer surface areas were used. However, in modern memory devices where the dimensions of the device are continuously being miniaturized, methods for reducing the chip real estate required for a capacitor becomes more important. One of the methods encompasses a design of stacking a capacitor over the bit line on the surface of a silicon substrate in order to increase the specific capacitance of a storage capacitor. The stacked capacitor is formed by a layer of a dielectric material such as silicon dioxide or oxide-nitride-oxide sandwiched between two layers of polysilicon. The effective capacitance of the stacked capacitor cell is increased over that of a conventional planar cell due to its increased surface area.

Other techniques have also been tried in achieving higher capacitance on limited chip real estate. For instance, one method stores charges vertically in a trench which requires a deep trench formation resulting in significant processing difficulties. The stacked capacitor approach is therefore a well accepted and popular approach for achieving higher specific capacitance in a DRAM storage capacitor.

One of the possible configurations for a stacked capacitor is a fin-type stacked capacitor in which multiple number of fins generally formed of polysilicon is used as the bottom electrode for the capacitor. The increased surface areas on the fins contribute to the increased specific capacitance. A typical method for forming a fin-type stacked capacitor is shown in FIGS. 1A through 1G.

Figure 1A:
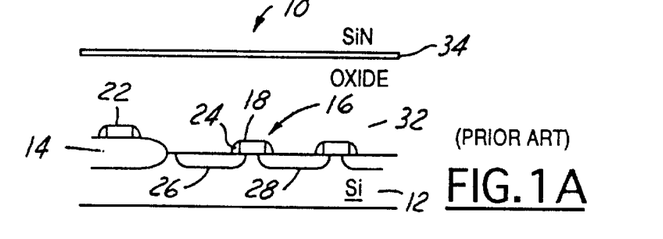
FIG. 1A is an enlarged, cross-sectional view of a semiconductor structure for forming a fin-type stacked capacitor thereon by a conventional method.

Referring initially to FIG. 1A, wherein a conventional semiconductor structure is shown. The semiconductor 10 consists of a silicon substrate 12 onto which a field oxide region 14 is first formed to isolate the field effect transistors 16. The field oxide 14 is typically formed by a LOCOS method during which silicon is thermally oxidized to form and to expand vertically into a silicon oxide region. The field effect transistor 16 is generally formed by first growing a thin oxide layer (not shown) on the silicon substrate as a gate oxide layer, and then forming a polysilicon gate electrode 18 on top of the gate oxide layer. The polysilicon layer which forms the gate electrode 18 is also used to form word line 22 over the field oxide 14 to provide interconnections between the transistors and the peripheral circuits on the chip. After lightly doped drain areas are formed in the substrate by an ion implantation method and sidewall spacers 24 are formed on the gate electrode 18, the transistor formation is completed by forming source/drain contact areas 26, 28 in the silicon substrate 12 adjacent to the gate electrode 18. A thick insulating layer 32 can be deposited over the gate electrode 18 and the word line 22 for electrical insulation. A silicon nitride etch stop layer 34 is then deposited over a planarized top surface of the insulating layer 32. The planarization process for the insulating layer 32 can be carried out advantageously by a chemical mechanical polishing technique.

Figure 1B:
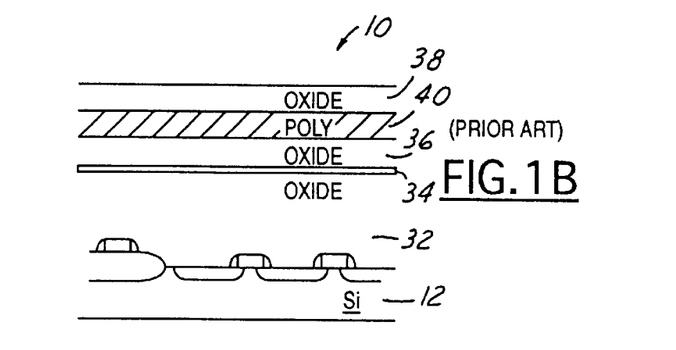
FIG. 1B is an enlarged, cross-sectional view of the semiconductor structure of FIG. 1A with multiple layers of oxide and polysilicon deposited on top.
Figure 1C:
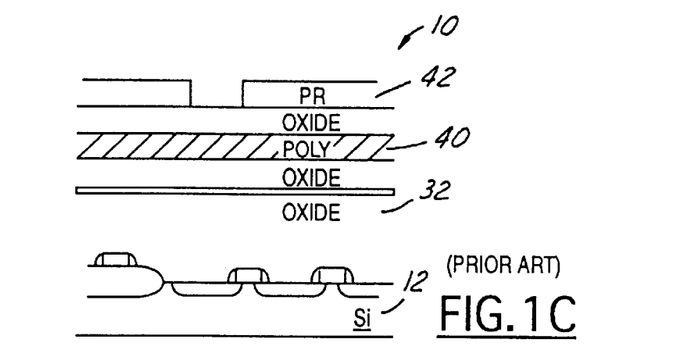
FIG. 1C is an enlarged, cross-sectional view of the semiconductor structure of FIG. 1B with an additional photoresist layer deposited and patterned on top.
Figure 1D:
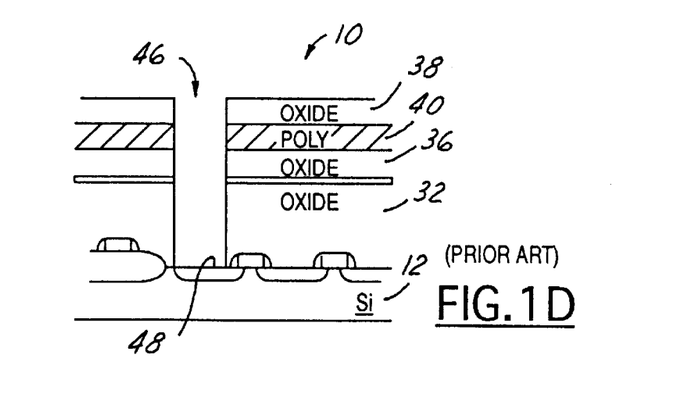
FIG. 1D is an enlarged, cross-sectional view of the semiconductor structure of FIG. 1C having a contact opening formed to expose a node contact.

In a conventional fin-type stacked capacitor process, as shown in FIG. 1B, oxide layers 36, 38 and polysilicon layer 40 are deposited by a chemical vapor deposition technique on top of a silicon nitride etch step layer 34. The number of layers of polysilicon deposited is optional depending on the number offins ofthe stacked capacitor desired. On top of the final oxide layer 38, a photoresist layer 42 is then deposited and patterned. This is shown in FIG. 1C. Conventional photolithographic techniques and anisotropic plasma dry etching method are then used to form a contact opening 46. This is shown in FIG. 1D. The oxide layers 32, 36 and 38 and the polysilicon layer 40 are etched away to form the window opening such that a node contact 48 on the active area of the source/drain 26 is formed. The multiple layers of oxide and polysilicon can be etched in a reactive ion etching method by an etchant gas mixture containing fluorine or other etchant gas.

Figure 1E:
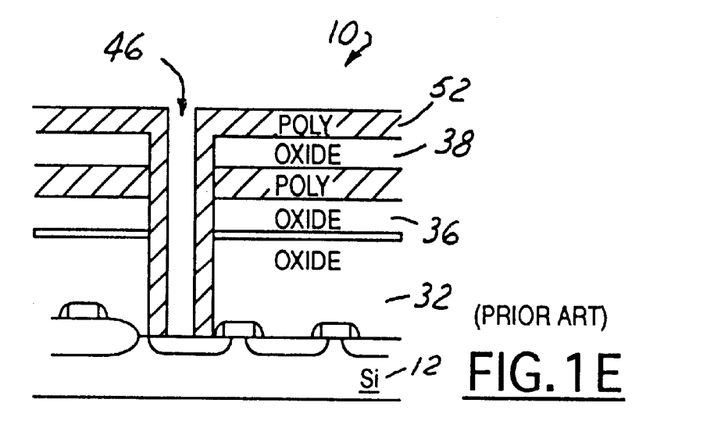
FIG. 1E is an enlarged, cross-sectional view of the semiconductor structure of FIG. 1D having a polysilicon bottom electrode layer deposited thereon.
Figure 1F:
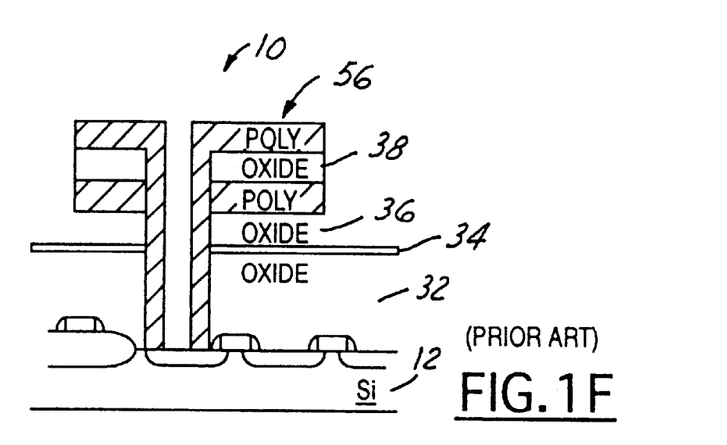
FIG. 1F is an enlarged, cross-sectional view of the semiconductor structure of FIG. 1E having a bottom polysilicon electrode patterned and formed.
Figure 1G:
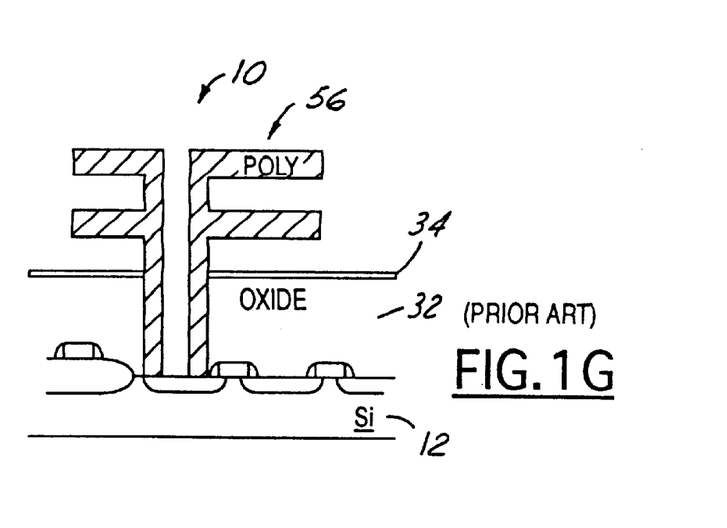
FIG. 1G is an enlarged, cross-sectional view of the semiconductor structure of FIG. 1F having the oxide layers removed to expose the bottom electrode for the fin-type stacked capacitor.

After the opening of the contact window 46 and the formation of the node contact 48 for the stacked capacitor to be built, a polysilicon layer 52 is blanket deposited over the oxide layer 38 and into the contact opening 46. The polysilicon layer 52 can be deposited by a low pressure to chemical vapor deposition (LPCVD) technique. The polysilicon layer 52 is then patterned by a photoresist layer (not shown) to define a bottom electrode 56. The anisotropic etching process for defining the bottom electrode 56 stops at the oxide layer 36. In the next processing step, a wet chemical etching method is used to remove the oxide layers 36 and 38 while maintaining the bottom electrode 56 intact and thus forming a freestanding fin-type polysilicon electrode 56 for the capacitor. This is shown in FIG. 1G. Onto the bottom electrode 56, a thin dielectric layer (not shown) and a thick polysilicon layer (not shown) are then deposited and patterned to form the capacitor dielectric and the capacitor top plate.

The conventional process for forming a fin-type stacked capacitor is a complicated process which requires multiple deposition steps for forming the multiple layers of oxide and polysilicon on top of the active device such that the fins can be formed. The process requires multiple deposition steps conducted in a series of processing chambers. It is a time consuming process which leads to low yield for the fabrication of fin-type stacked capacitors.

It is therefore an object of the present invention to provide a method for forming a fin-type DRAM stacked capacitor that does not have the drawbacks and shortcomings of a conventional capacitor forming process.

It is another object of the present invention to provide a method for forming a fin-type DRAM stacked capacitor by depositing multiple layers of different insulating materials in a single deposition process.

It is a further object of the present invention to provide a method for forming a fin-type DRAM stacked capacitor by depositing multiple layers of different insulating materials that have different etch rates in a single process chamber.

It is another further object of the present invention to provide a method for forming a fin-type DRAM stacked capacitor by first forming multiple layers of doped oxide and non-doped oxide insulating materials which have different etch rates.

It is still another object of the present invention to provide a method for forming a fin-type DRAM stacked capacitor by first depositing multiple layers of different oxide materials that have an etch rate ratio of greater than 3 when etched in a wet etch process.

It is yet another object of the present invention to provide a method for forming a fin-type DRAM stacked capacitor by first depositing multiple layers of different oxide materials, dry etching a contact opening through the layers, and then wet etching the oxide layers which have different etch rates so that a zig-zag configuration in the contact opening is formed.

It is still another further object of the invention to provide a method for forming a fin-type DRAM stacked capacitor by first forming a zig-zag configured contact opening and then depositing a polysilicon bottom electrode into the opening.

It is yet another further object of the present invention to provide a method for forming a fin-type DRAM stacked capacitor by first depositing multiple layers of doped and undoped oxide layers and then wet etching such layers by an etchant containing $NH_4OH$ and $H_2O_2$ at an etch rate ratio of at least 3.

SUMMARY OF THE INVENTION

In accordance with the present invention, a method for forming a fin-type DRAM stacked capacitor by first depositing multiple layers of different insulating materials in a single deposition process and in a single deposition chamber, and then wet etching the multiple layers to, form a zig-zag configured contact opening such that a bottom electrode having increased surface area can be formed.

In a preferred embodiment, a method for forming a fin-type DRAM stacked capacitor in multiple layers of insulating materials that are deposited in a single deposition process can be carried out by the operating steps of first positioning a preprocessed semiconductor substrate in a process chamber, then providing at least two gas outlets each having a gas discharge nozzle in the chamber, then sequentially depositing at least two layers of different insulating materials on the preprocessed semiconductor substrate by at least two different reactant gases flown from the at least two gas outlets, then forming a contact opening through the at least two layers of insulating materials to expose the preprocessed semiconductor substrate, then wet etching the contact opening with an etchant which has substantially different etch rates for the at least two layers of different insulating materials such that a zig-zag contour is formed in the contact opening, then depositing a polysilicon layer in the contact opening forming a bottom electrode, and then sequentially depositing an insulating layer as a capacitor dielectric and a polysilicon layer as a capacitor upper electrode.

In another preferred embodiment, a method for forming a DRAM capacitor which has improved charge capacity can be carried out by the operating steps of first providing a process chamber equipped with at least two reactant gas outlets, then positioning a preprocessed semiconductor substrate in the chamber, then depositing a layer of a first insulating material on the substrate from one of the at least two reactant gas outlets, the first insulating material has a first etch rate, then depositing a layer of a second insulating material on top of the first insulating material layer from the other of the at least two reactant gas outlets, the second insulating material has a second etch rate that is sufficiently different than the first etch rate, then etching a substantially cylindrical shaped contact window through the layers of the first and the second insulating material to expose an active region on the preprocessed semiconductor substrate, then etching a zig-zag configuration in the contact window by an etchant which has substantially different etch rates for the first and second insulating material, and then sequentially depositing a bottom polysilicon layer, a middle dielectric layer and a top polysilicon layer for forming the capacitor.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for forming a fin-type DRAM stacked capacitor by first depositing multiple layers of different insulating materials in a single deposition process and in a single process chamber, then dry etching a contact opening through the layers to expose a node contact, and then wet etching the contact opening with an etchant which has different etch rates for the different insulating materials such that a zig-zag configuration in the contact opening is formed.

Figure 2:
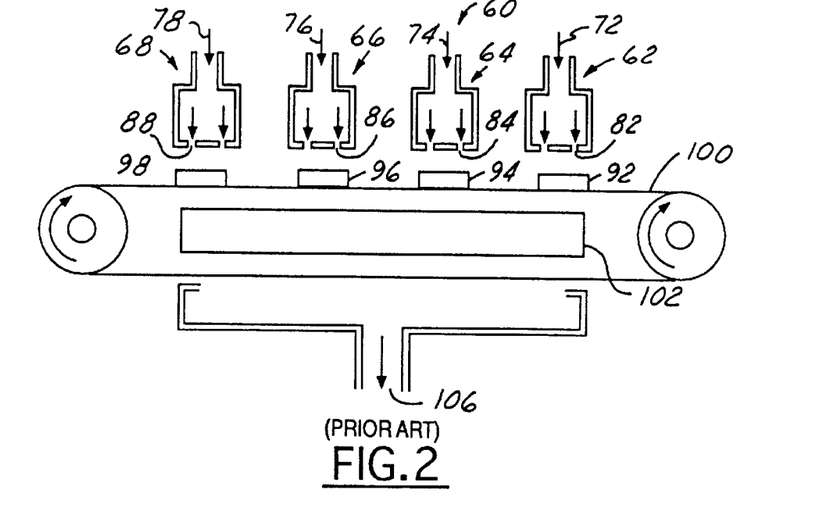
FIG. 2 is an illustration of the present invention deposition apparatus equipped with multiple reactant gas outlets for depositing multiple number of films on semiconductor substrates.

Referring now to FIG. 2, wherein it is shown a simplified illustration of the deposition apparatus used in the present invention method. The deposition apparatus 60 is positioned in a conventional chemical vapor deposition chamber (not shown). The apparatus 60 is equipped with a multiple number of reactant gas outlet nozzles 62, 64, 66 and 68 each having a reactant gas mixture 72, 74, 76 and 78 flown therethrough respectively. The nozzles 62, 64, 66 and 68 are further equipped with gas outlets, or showerheads 82, 84, 86 and 88 for depositing a multiple number of films on substrates 92, 94, 96 and 98 which are conveyed on a conveyor belt 100. As the mixtures of reactant gases are fed from the showerheads 82, 84, 86 and 88 onto the various substrates, a chemical reaction is induced by the heat supplied from heater 102 to form oxide films on the substrates. The spent reactant gases are exhausted through outlet 106 out of the CVD chamber (not shown).

Figure 3A:
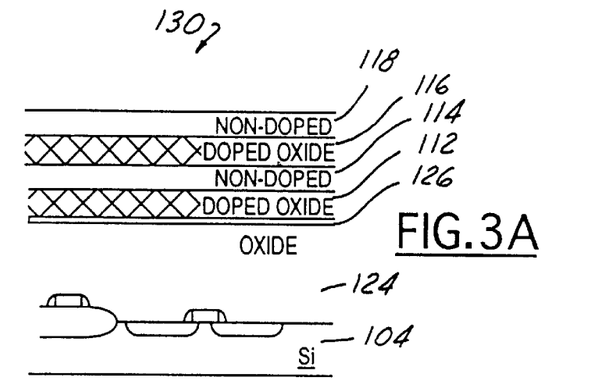
FIG. 3A is an enlarged, cross-sectional view of a present invention semiconductor structure having a multiple number of doped and non-doped oxide layers deposited on top.

The novel apparatus utilized by the present invention method, as shown in FIG. 2, enables the deposition of alternating layers of doped oxide and non-doped oxide on a preprocessed semiconductor structure such as that shown in FIG. 3A. The substrates 92, 94, 96 and 98 are moved at a slow speed on conveyor belt 100 under the showerheads 82, 84, 86 and 88. Reactant gases 72, 74, 76 and 78 are fed into the respective gas nozzles 62, 64, 66 and 68. For instance, the reactant gases of tetraethoxysilane (TEOS) can be advantageously used. In the four-nozzle arrangement shown in FIG. 2, the TEOS reactant gas 72 and 76 can be doped with boron and phosphorous such that an in-situ doped BPTEOS is used to deposit BPSG (borophosphosilicate glass) films at stations where substrates 92 and 96 are located. The reactant gases 74 and 78 are not doped and thus non-doped oxide layers are formed on the substrate 94 and 98. When the conveyor belt 100 is moved at a predetermined speed, a semiconductor substrate traveling under all four nozzles 62, 64, 66 and 68 can have sequentially deposited layers of doped oxide, non-doped oxide, doped oxide and non-doped oxide layers 112, 114, 116 and 118 (shown in FIG. 3A) deposited on top of the semiconductor structure 130. The semiconductor structure 130 consists of a silicon substrate 104, an insulating layer 124, a silicon nitride etch stop layer 126 deposited on top prior to the deposition process for the multiple oxide films.

It should be noted that the speed of the conveyor belt 100 an be suitably adjusted to achieve the desirable thicknesses of the various deposited films. The thickness and the quality of the films can be further adjusted by the heat supplied from heater 102 to the deposition apparatus 60. A deposition process utilizing tetraethoxysilane can be carried out at a reaction temperature in the range of between about 600° C. and about 900° C. The in-situ doping of the TEOS reactant gas can be accomplished by adding dopant gases such as phosphine ($PH_3$) for phosphorous and diborane ($D_2H_6$) for boron to the TEOS gas flow. The deposition process can be advantageously conducted by a low pressure chemical vapor deposition (LPCVD) technique. Borophosphosilicate glass (BPSG) is formed by the doped TEOS reactant. Prior to the deposition processes for the multiple oxide layers, the top surface of the oxide layer 124 on the semiconductor device 130 should be planarized by either a reflow process or by a chemical mechanical polishing technique before a silicon nitride etch stop layer 126 is deposited.

The thickness of the insulating (oxide) layer 124 required is dependent upon the to roughness of the topography on the underlying semiconductor structure. A suitable thickness for the oxide layer 124 is between about 2000 Å and about 4000 Å after a chemical mechanical polishing process. Each of the oxide layers 112, 114, 116 and 118 can be deposited to a suitable thickness between about 500 Å and about 3000 Å. The oxide layers may also be deposited by a silane chemistry or by an ozone-TEOS chemistry in a sub-atmospheric chemical vapor deposition (SACVD) process.

Figure 3B:
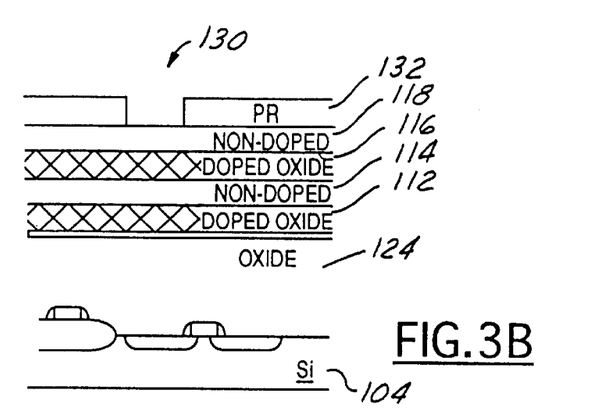
FIG. 3B is an enlarged, cross-sectional view of the semiconductor structure of FIG. 3A having an additional photoresist layer deposited and patterned on top.
Figure 3C:
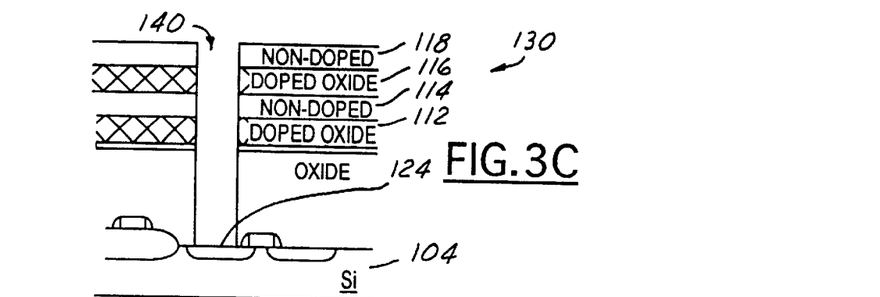
FIG. 3C is an enlarged, cross-sectional view of the semiconductor structure of FIG. 3B having a contact opening formed therein for exposing a node contact.

After the successive depositions of the doped and the non-doped oxide layers, conventional photolithographic techniques and anisotropic plasma etching technique can be used to form a contact opening 140 to expose a node contact 142. This is shown in FIGS. 3B and 3C. A photoresist layer 132 is first deposited and then patterned on top of the non-doped oxide layer 118. An anisotropic plasma etching technique is conducted by a reactive ion etching method for etching through the multiple layers of oxides. A suitable etchant gas can be a mixture of fluorine-containing compounds, i.e., trifluoromethane ($CHF_3$) and carbon tetrafluoride ($CF_4$) at a chamber pressure of approximately 200~400 mTorr.

Figure 3D:
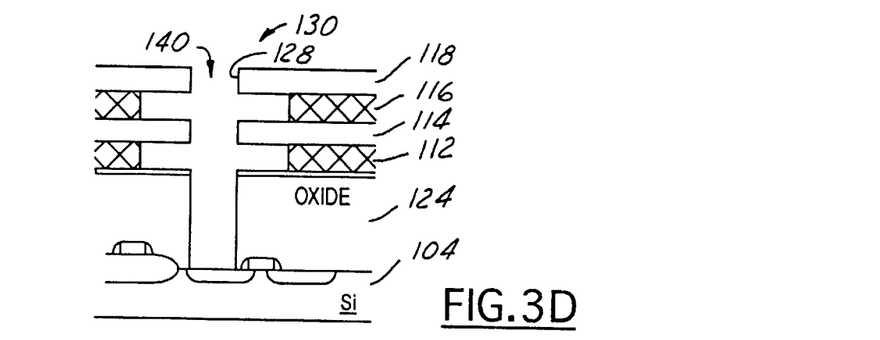
FIG. 3D is an enlarged, cross-sectional view of the semiconductor structure of FIG. 3C after a wet etching process for forming a zig-zag configuration in the contact opening.

In the next step of the process, the novel present invention method can be carried out by a wet etch step by using an etchant that has substantially different etch rates for doped oxide and for non-doped oxide. This is shown in FIG. 3D. It has been found that by choosing a suitable etchant, such as SC1 used in the present invention preferred embodiment, a substantially different etch rate can be obtained for the doped oxide layers and for the non-doped oxide layers. For instance, when the multiple layers are exposed to SC1 (a mixture of $NH_4OH$, $H_2O_2$ and $H_2O$), the etch rate for the doped oxide is approximately 40 Å/min while the etch rate for the non-doped oxide is approximately <5 Å/min. There exists an etch rate ratio of approximately 8 folds. To maintain a reasonably short etch time, it was discovered that an etch rate ratio larger than 3 is desirable. While SC1 etchant has been utilized in the present invention preferred embodiment, other etchants may also be suitably used in the present invention novel method. For instance, a water solution of hydrofluoric acid in the concentration range between about 1:10 and about 1:50 ($HF:H_2O$) may also be used as the etchant solution. An etch rate ratio obtained between the doped oxide and the non-doped oxide by using the hydrofluoric acid solution is between approximately 3:1 and 5:1 with the doped oxide being etched faster. FIG. 3D shows the result after a wet etch method by SC1 etchant is conducted on the present invention semiconductor structure 130.

Figure 3E:
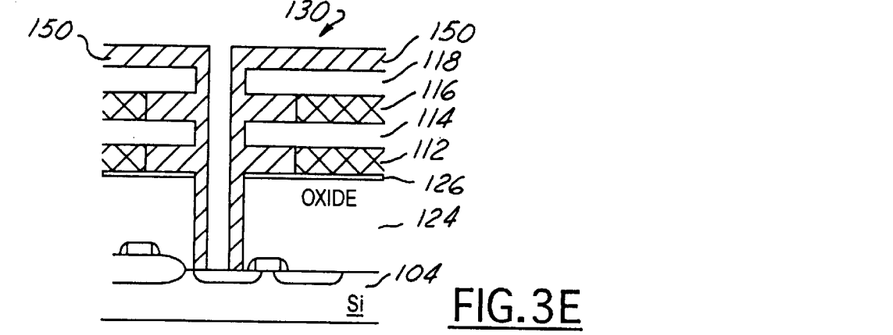
FIG. 3E is an enlarged, cross-sectional view of the semiconductor structure of FIG. 3D after a polysilicon layer is deposited on top.
Figure 3F:
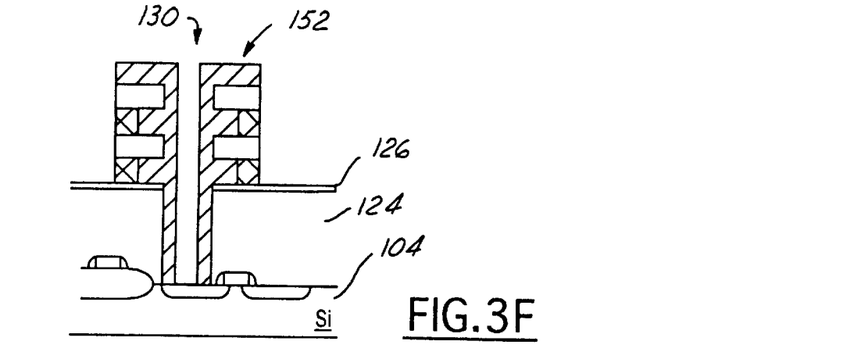
FIG. 3F is an enlarged, cross-sectional view of the semiconductor structure of FIG. 3E after a bottom electrode structure is patterned and formed.

In the next step of the process, as shown in FIG. 3E, a bottom electrode polysilicon layer 150 is deposited as a conformal polysilicon layer which covers the recessed area 128 )FIG. 3D) and the top of the oxide layer 118. The polysilicon layer 150 can be advantageously deposited by a low pressure chemical vapor deposition technique. It may be desirable to dope the polysilicon layer to improve its electrical conductivity by an in-situ doping method during deposition. For instance, phosphine ($PH_3$) can be used to supply phosphorous ions to a silane reactant gas during the deposition process. A suitable thickness for the polysilicon layer 150 is between about 800 Å and about 2000 Å.

polysilicon bottom electrode layer 150 is then patterned by using conventional photolithographic method and anistropically etched by a plasma etching technique to form a bottom electrode 152. This is shown in FIG. 3F. The anisotropic etching process stops at the silicon nitride etch stop layer 126. Even though the use of layer 118 as the etch stop layer is preferred for simplicity reasons due to the high selectivity of poly to oxide in a poly etcher.

Figure 3G:
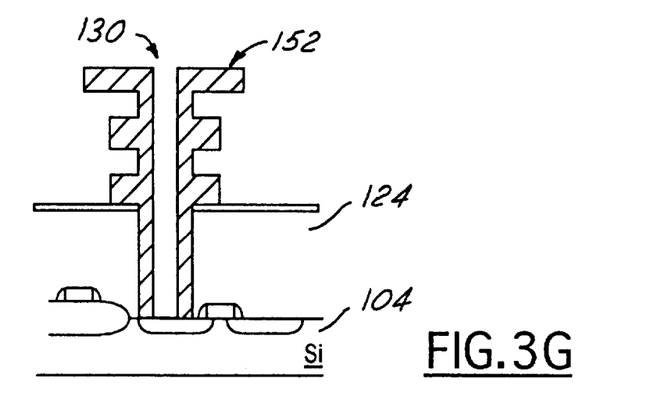
FIG. 3G is an enlarged, cross-sectional view of the semiconductor structure of FIG. 3F after the oxide layers are removed by a wet etching process.

In the next process step, the non-doped oxide layers 114, 118 and the doped oxide layers 112 and 116 are removed by a wet etch method completely to the silicon nitride etch stop layer 126. This is shown in FIG. 3G. A suitable wet etch method can be conducted with a hydrofluoric acid (HF) solution and thereafter leaving a free standing bottom electrode 152 as depicted in FIG. 3G.

Figure 3H:
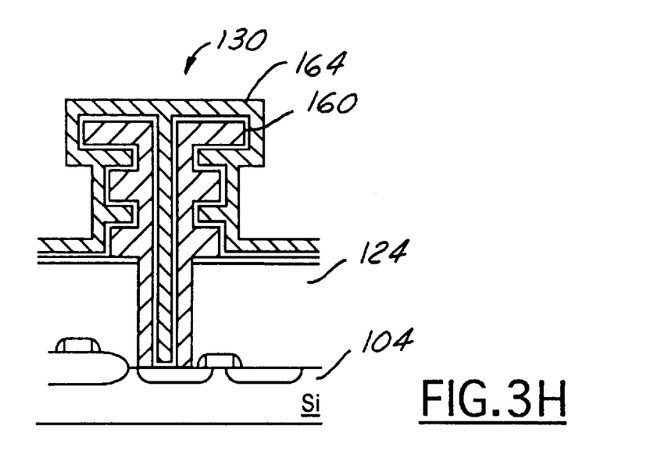
FIG. 3H is an enlarged, cross-sectional view of the semiconductor structure of FIG. 3G after a thin dielectric layer and a thick polysilicon layer are deposited on top.

A thin dielectric layer 160 is then deposited on the surface of the freestanding bottom electrode 152 to a thickness between about 50 Å and about 150 Å. The dielectric layer can be suitably deposited of a high dielectric constant material, for instance, a preferred dielectric layer is an oxidenitride composite layer or an oxide-nitride-oxide (ONO) composite layer. These layers can be deposited by a conventional deposition technique of LPCVD. After the deposition of the dielectric layer 160, a final polysilicon layer 164 is conformably deposited on top of the freestanding bottom electrode 152 and the dielectric layer 160. This is also shown in FIG. 3H. The polysilicon layer 164 can be deposited by a conventional LPCVD method to a thickness of between about 1500 Å and about 3000 Å. It may be desirable to in-situ dope the polysilicon layer 164 with a dopant to improve its electrical properties. The polysilicon layer 164 is then patterned by conventional photolithographic method and formed into a top electrode 168. This is shown in FIG. 3I.

Figure 3I:
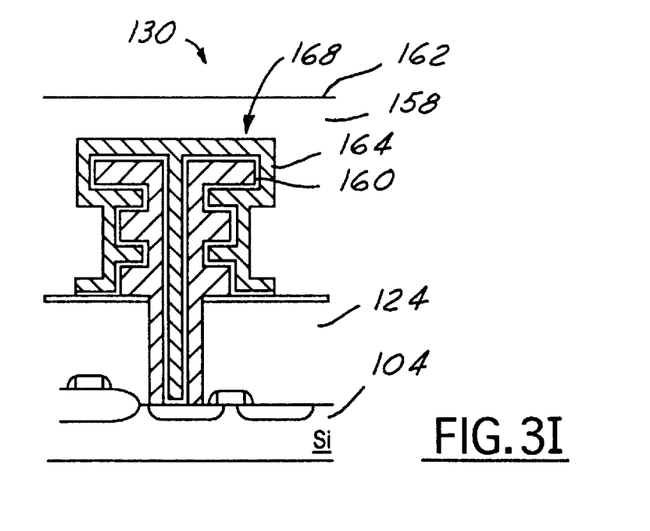
FIG. 3I is an enlarged, cross-sectional view of the semiconductor structure of FIG. 3H after the upper polysilicon electrode is patterned and formed and an insulating layer is deposited on top.

Also shown in FIG. 3I, is a thick insulating layer 158 deposited to encase the upper electrode 168 of the capacitor. The thick insulating layer 158 is planarized to prepare the DRAM circuit for the next level of processing and integration. The insulating layer 158 can be suitably deposited of a doped oxide material such as borophosphosilicate glass (BPSG) by a conventional CVD method. The insulating layer 158 is then planarized by a chemical mechanical polishing method to produce a smooth upper surface 162. The insulating layer 158 may also be planarized by an annealing or reflow process when the layer is deposited of a BPSG material.

While the present invention has been described in an illustrative manner, it should be understood that the terminology used is intended to be in a nature of words of description rather than of limitation.

Furthermore, while the present invention has been described in terms of a preferred embodiment and the alternate embodiments, it is to be appreciated that those skilled in the art will readily apply these teachings to other possible variations of the inventions.

The embodiment of the invention in which an exclusive property or privilege is claimed are defined as follows:

1. A method for forming a fin-type capacitor in multiply layers of insulating materials that are deposited in a single deposition process comprising the steps of:
    positioning a preprocessed semiconductor substrate on a moving belt in a process chamber,
    providing at least two gas outlets each having a gas discharge nozzle facing and juxtaposed to said moving belt in said chamber,
    sequentially depositing at least two layers of different insulating materials on said preprocessed semiconductor substrate positioned on said moving belt by at least two different reactant gases flown from said at least two gas outlets,
    forming a contact opening through said at least two layers of insulating materials exposing said preprocessed semiconductor substrate,
    wet etching said contact opening with an etchant having substantially different etch rates for said at least two layers of different insulating materials such that a zig-zag configuration is formed in the contact opening,
    depositing a polysilicon layer in the contact opening forming a bottom electrode, and
    sequentially depositing an insulating layer as a capacitor dielectric and a polysilicon layer as a capacitor upper electrode.

2. A method according to claim 1, wherein said preprocessed semiconductor substrate comprises transistors and insulating regions formed in a silicon substrate and an insulating layer encasing the transistors and the insulating regions.

3. A method according to claim 1, wherein said process chamber is a chemical vapor deposition chamber equipped with at least two gas outlets/shower heads.

4. A method according to claim 1, wherein said process chamber is a low pressure chemical vapor deposition chamber equipped with four gas outlets/shower heads.

5. A method according to claim 1, wherein said at least two layers of different insulating materials comprise two layers of silicon oxide materials having substantially different etch rates.

6. A method according to claim 1, wherein said at least two layers of different insulating materials comprise a layer of doped silicon oxide and a layer of non-doped silicon oxide.

7. A method according to claim 1, wherein said at least two layers of different insulating materials comprise two layers of doped silicon oxide and two layers of non-doped silicon oxide alternatingly stacked together.

8. A method according to claim 1, wherein said substantially different etch rates for said at least two layers of different insulating materials produce an etch rate ratio of 1:3 or 3:1.

9. A method according to claim 1, wherein said wet etching step further comprising exposing said contact opening to an etchant comprises $NH_4OH$ and $H_2O_2$.

10. A method according to claim 1, wherein said wet etching step further comprising exposing said contact opening to an etchant comprises HF.

11. A method according to claim 1, wherein said single deposition process is carried out in a continuous chemical vapor deposition chamber wherein a plurality of wafers are carried on a conveyor belt.

12. A method according to claim 2, wherein said insulating layer encasing said transistors and insulating regions has a planarized top surface.

13. A method according to claim 1, wherein said contact opening forming step further comprises etching said contact opening by a reactive ion etching method.

14. A method for forming a DRAM capacitor having improved charge capacity comprising the steps of:

provuding a process chamber equipped with a moving belt and at least two reactant gas outlets facing and juxtaposed to said moving belt, positioning a preprocessed semiconductor substrate on said moving belt in said chamber, depositing a layer of a first insulating material on said substrate from one of said at least two reactant gas outlets, said first insulating material has a first etch rate, depositing a layer of a second insulating material on top of said layer of first insulating material from the other of said at least two reactant gas outlets, said second insulating material has a second etch rate sufficiently different than said first etch rate, etching a substantially cylindrical shaped contact window through said layers of first and second insulating materials exposing an active region on said preprocessed semiconductor substrate, etching a zig-zag configuration in said contact window by an etchant having substantially different etch rates for said first and said second insulating materials, and sequentially depositing a bottom polysilicon layer, a middle dielectric layer and a top polysilicon layer forming said capacitor.

15. A method according to claim 14, wherein said process chamber is a low pressure chemical vapor deposition chamber equipped with four reactant gas outlets arranged longitudinally over a conveyor belt which carries preprocessed semiconductor substrates.

16. A method according to claim 15, wherein said four reactant gas outlets are arranged in such a way that two different reactant gases are conveyed by said outlets alternatingly.

17. A method according to claim 14, wherein said first insulating material is a doped silicon oxide and said second insulating material is a non-doped silicon oxide.

18. A method according to claim 17, wherein said doped silicon oxide has a wet etch rate that is at least 3 times greater than the wet etch rate of said non-doped silicon oxide.

19. A method according to claim 14, wherein said first etch rate and said second etch rate are different by at least 3 folds.

20. A method according to claim 14, wherein said substantially cylindrically shaped contact window is formed by a reactive ion etching process.

21. A method according to claim 20, wherein said reaction ion etching process comprises fluorine-containing etchant gas.

22. A method according to claim 20, wherein said reactive ion etching process comprises $CHF_3$ and $CF_4$.

23. A method according to claim 14, wherein said step of forming a zig-zag configuration in said contact window is a wet dip step utilizing an etchant comprises $NH_4OH$ and $H_2O_2$.

24. A method according to claim 14, wherein said step of forming a zig-zag configuration in said contact window is a wet dip step utilizing an etchant comprises HF.

25. A method according to claim 17, wherein said doped silicon oxide is doped in-situ.

26. A method according to claim 17, wherein said doped silicon oxide is formed by a boron-phosphorous TEOS reactant.

27. A method according to claim 14, wherein said deposition processes are carried out continuously by depositing layers on a plurality of wafers carried on a conveyor belt.

28. A method according to claim 14, wherein said preprocessed semiconductor substrate comprises a planarized top surface of an insulating material layer.

* * * * *